US009515625B2

(12) United States Patent
Camilleri (10) Patent No.: US 9,515,625 B2
(45) Date of Patent: Dec. 6, 2016

(54) MULTI-VARACTOR APPROACH FOR IMPROVED VCO GAIN

(71) Applicant: Nitero Pty Ltd., Fitzroy, Victoria (AU)

(72) Inventor: Natalino Camilleri, Cupertino, CA (US)

(73) Assignee: Nitero Pty Ltd, Victoria (AU)

( * ) Notice: Subject to any disclaimer, the term of this patent is extended or adjusted under 35 U.S.C. 154(b) by 0 days.

(21) Appl. No.: 14/477,823

(22) Filed: Sep. 4, 2014

(65) Prior Publication Data

US 2016/0072463 A1 Mar. 10, 2016

(51) Int. Cl.
*H03B 5/08* (2006.01)
*H03G 1/00* (2006.01)
*H03B 5/12* (2006.01)
*H01G 4/40* (2006.01)

(52) U.S. Cl.
CPC .............. *H03G 1/0035* (2013.01); *H03B 5/08* (2013.01); *H03B 5/1243* (2013.01); *H03B 5/1265* (2013.01); *H01G 4/40* (2013.01); *H03J 2200/10* (2013.01)

(58) Field of Classification Search
CPC ..... H03B 1/00; H03B 2201/0208; H03B 5/08; H03B 5/1243; H03B 5/1265; H03J 2200/10; H01G 4/40; H03G 1/0035
USPC ..................... 331/167, 177 V, 117 FE, 117 R
See application file for complete search history.

(56) References Cited

U.S. PATENT DOCUMENTS

| | | | | |
|---|---|---|---|---|
| 8,253,506 B2* | 8/2012 | Liu | ......................... | H03L 1/023 331/117 R |
| 2010/0052795 A1* | 3/2010 | Nakamura | ................ | H03J 3/20 331/10 |
| 2011/0018642 A1* | 1/2011 | Li | ........................ | H03B 5/1228 331/108 R |
| 2016/0156311 A1* | 6/2016 | Ainspan | ................... | H03B 1/00 331/117 FE |

* cited by examiner

*Primary Examiner* — Arnold Kinkead
(74) *Attorney, Agent, or Firm* — Hickman Palermo Becker Bingham LLP; Edward A. Becker (57) ABSTRACT

An apparatus with a multi-varactor circuit for suppressing VCO gain is described herein. According to an embodiment, the apparatus comprises a plurality of varactor stages that are electrically coupled in parallel. For two or more varactor stages of the plurality of varactor stages, each respective varactor stage of the two or more varactor stages includes a set of one or more varactors that are electrically coupled to a tuning source. Each respective varactor stage of the two or more varactor stages is configured to vary a respective capacitance based on a tuning voltage from the tuning source and to be biased at a different respective voltage level. In other embodiments, the set of one or more varactors for each varactor stage of the two or more varactor stages includes at least one digitally-controlled switched varactor. The digitally-controlled switched varactors may be selectively connected to the tuning source.

20 Claims, 7 Drawing Sheets

MULTI-VARACTOR APPROACH FOR IMPROVED VCO GAIN

FIELD OF THE DISCLOSURE

The present disclosure generally relates to voltage controlled oscillators (VCOs), generally, and more specifically to techniques for maintaining a relatively constant VCO gain across different tuning voltages.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Wideband VCOs are electronic oscillators where the oscillation frequency may be tuned over a large range of frequencies. In one design approach, the wideband VCO's large tuning range is realized by using a switched capacitor array that is electronically coupled in parallel with a single varactor connection and an inductor. The switched capacitor array enables coarse frequency tuning via a digital control signal that switches capacitors into and out of the LC tank. Such coarse tuning is typically referred to as digital tuning since different digital control codes may be used to switch between different operating frequency bands. Within each frequency band, fine tuning, also referred to as analog tuning, is realized by applying a control voltage to the varactor to adjust the varactor's capacitance.

While the above approach allows for a large tuning range, the cube of the oscillation frequency is directly proportional to the VCO's gain, represented as $K_{VCO}$, when only one varactor is used. Due to this relationship and the nonlinear capacitance-to-voltage characteristic response of the varactor, $K_{VCO}$ varies widely both over different control voltages within a given frequency band and across different frequency bands supported by the switched capacitor array. Generally, the $K_{VCO}$ variation increases as the frequency tuning range of the VCO is stepped up.

A large $K_{VCO}$ variation has negative implications for phased locked loops (PLLs) in which such wideband VCOs are employed. For example, a change in $K_{VCO}$ may cause the PLL loop bandwidth to vary between different frequency bands, increasing phase noise at higher frequencies. In addition, the loop stability of the PLL may be negatively impacted, resulting in longer settling times, phase error, and/or jitter. Thus, large $K_{VCO}$ fluctuations may significantly degrade the performance of such electronic circuits.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

I. Overview

Techniques are described herein for minimizing VCO gain variation over a wide tuning range. Embodiments include an apparatus comprising a multi-stage varactor circuit that includes a plurality of parallel connected varactor stages. A "varactor stage" as used herein refers to a set of one or more varactors that are biased at a particular voltage level and are electronically coupled to a tuning source for receiving a tuning voltage such that the capacitance of the one or more varactors changes responsive to changes in the tuning voltage. Each respective varactor stage is biased at different respective voltage levels to linearize the tuning sensitivity of the VCO. By linearizing the tuning sensitivity, the VCO gain may remain substantially constant during analog tuning of the oscillation frequency.

In order to further suppress VCO gain variation, embodiments include digitally controlling the number of varactors that are connected to the control line at each varactor stage. Each stage of the multi-stage varactor circuit includes a respective set of one or more non-switched varactors and a respective set of one or more switched varactors. As the frequency band is stepped up during digital turning, the number of varactors that are connected to the control line at each varactor stage is decreased, with at least one non-switched varactor remaining connected to the control line. Thus, as the oscillation frequency increases, the combined varactor size of each varactor stage decreases, thereby reducing the capacitance-to-voltage sensitivity ($dC_{var}/dV_{tune}$) of each varactor stage. Conversely, as the frequency band is decreased during digital tuning, additional varactors are connected to the control line at each varactor stage to increase the combined varactor size and the capacitance-to-voltage sensitivity of each varactor stage, thereby reducing $K_{VCO}$ variation.

Embodiments described herein may be employed in Radio Frequency Integrated Circuits (RFICs) that cover wide frequency ranges including, without limitation, the 60 GHZ frequency band. In such applications, the multi-stage varactor connection allows for a wide tuning range while suppressing $K_{VCO}$ variation. By minimizing $K_{VCO}$ variation, performance of RFIC transceivers that cover such frequency bands may be significantly improved.

II. Multi-Stage Varactor Connection

Figure 1A:
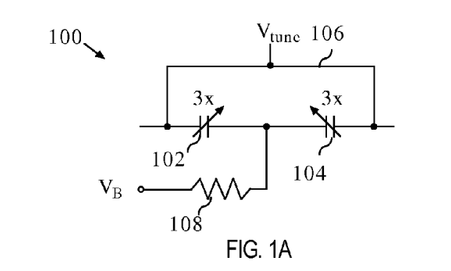
FIG. 1A, FIG. 1B, and FIG. 1C are simplified schematic diagrams depicting single-stage and multi-stage varactor connections.
Figure 1B:
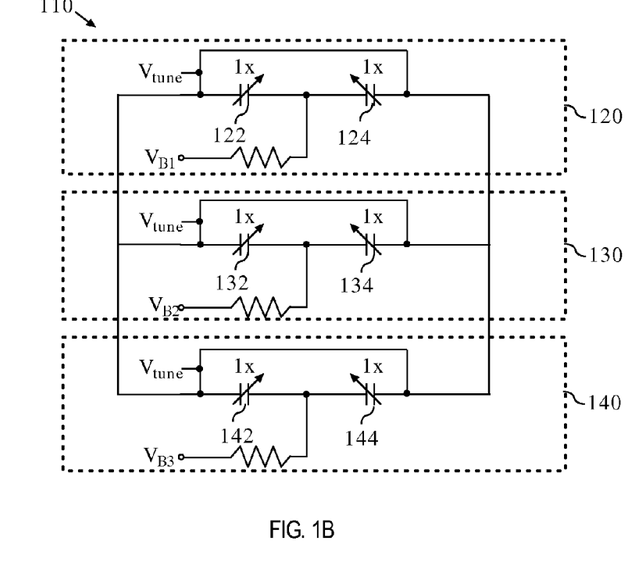
Figure 1C:
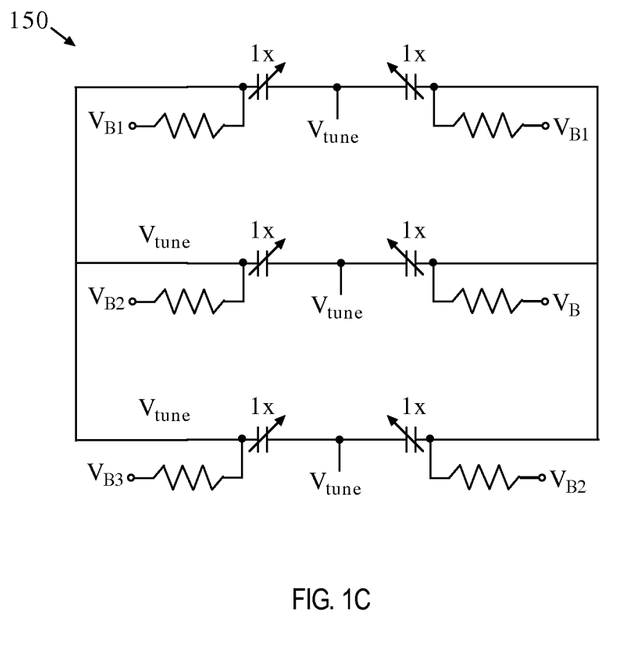

FIG. 1A, FIG. 1B, and FIG. 1C are simplified schematic diagrams depicting single-stage and multi-stage varactor connections, according to an embodiment. These circuits may be located within an RFIC package or outside of an integrated circuit package (e.g., on a printed circuit board) depending on the particular implementation. Referring first to FIG. 1A, single-stage varactor connection 100 includes varactors 102 and 104. The outer terminals of varactors 102 and 104 are electronically coupled to control line 106, which is configured to supply tuning voltage $V_{tune}$. The inner terminals of varactors 102 and 104 are electrically coupled to bias resistor 108 such that varactors 102 and 104 are biased at voltage $V_B$. The bias voltage is maintained substantially constant during tuning operations, whereas the value of $V_{tune}$ may be changed during analog tuning to vary the capacitance of varactors 102 and 104. Single-stage varactor connection 100 has a non-linear capacitance/voltage ($dC_{var}/dV_{tune}$) characteristic response as discussed in further detail below. This nonlinearity causes $K_{VCO}$ variation during analog tuning.

Referring next to FIG. 1B, multi-stage varactor connection 110 includes varactor stages 120, 130, and 140. Each varactor stage includes two varactors that are biased at a distinct voltage level and are electrically coupled to a control line supplying control voltage $V_{tune}$. Specifically, varactor stage 120 includes varactors 122 and 124 biased at $V_{B1}$, varactor stage 130 includes varactors 132 and 134 biased at $V_{B2}$, and varactor stage 142 and 144 biased at $V_{B3}$. Thus, a total of six varactors are used over three varactor stages in multi-stage varactor connection 110.

Multi-stage varactor connection 110 may be used in place of single-stage varactor connection 100 within a VCO to maintain $K_{VCO}$ at a substantially constant level (e.g., ±15%) during analog tuning. In such a scenario, the size of each varactor in multi-stage varactor connection 110 is one-third the size of each varactor in single-stage varactor connection 100. Thus, the combined varactor size of multi-stage varactor connection 110 is the same as single-stage varactor connection 100.

The arrangement of each varactor stage in the multi-stage varactor connection may vary from implementation to implementation. For example, FIG. 1C depicts multi-stage varactor connection 150, which is an alternative arrangement to multi-stage varactor connection 110. Rather than tuning the varactors at each stage from the outer terminals, the control line is electrically coupled to the inner terminal at each varactor stage. Similarly, the bias voltage for each stage is applied at the outer terminals instead of the inner terminals.

In other embodiments, the number and/or type of varactors at each stage may vary. For example, rather than two varactors, each varactor stage may include a single varactor or three or more varactors. The type of varactors at each stage may include, without limitation, semiconductor-based varactors, such as metal oxide semiconductor (MOS) varactor structures, or some other variable capacitive structure.

Multi-varactor connections 110 and 150 both have three stages and six varactors. This arrangement yields a substantially linear capacitance-to-voltage characteristic response, as demonstrated below. However, the number of stages may vary from implementation to implementation. In some embodiments, only two varactor stages may be employed. In other embodiments, more than three varactor stages may be employed. A distinct bias voltage is applied at each varactor stage to linearize the tuning range of the multi-varactor connection and suppress VCO gain.

The voltage levels that are applied at each varactor stage may vary from implementation to implementation. In an embodiment, a middle point direct current (DC) voltage is applied to a first varactor stage. Biases are then applied to other varactor stages by an offset amount or some multiple of the offset. For example, if the middle point bias is +0.75 Volts and the offset amount is ±0.75V, then a three-stage connection may include a first stage biased at approximately 0V (the middle point voltage−the 0.75V offset), a second stage biased at approximately 0.75 V (the middle point voltage), and a third stage biased at approximately +1.5V (the middle point voltage+the 0.75V offset). For a five-stage connection, a fourth stage may be biased at approximately −0.75V (the middle point voltage−two times the 0.75V offset) and a fifth stage biased at approximately +2.25V (the middle point voltage+two times the 0.75V offset). Other middle point voltages and/or offset amounts may also be used, depending on the particular implementation.

In some embodiments, each varactor stage of the multi-varactor connection includes a set of capacitors or other capacitive structures for capacitive coupling (also referred to herein as "AC coupling") of the multi-stage varactor connection. For example, varactors stage 120 may include a first capacitor that is electrically coupled to the outer terminal of varactor 122 and a second capacitor that is electrically coupled to the outer terminal of varactor 124. Similarly, varactor stages 130, and 140 may each include two capacitors for AC coupling.

Figure 2:
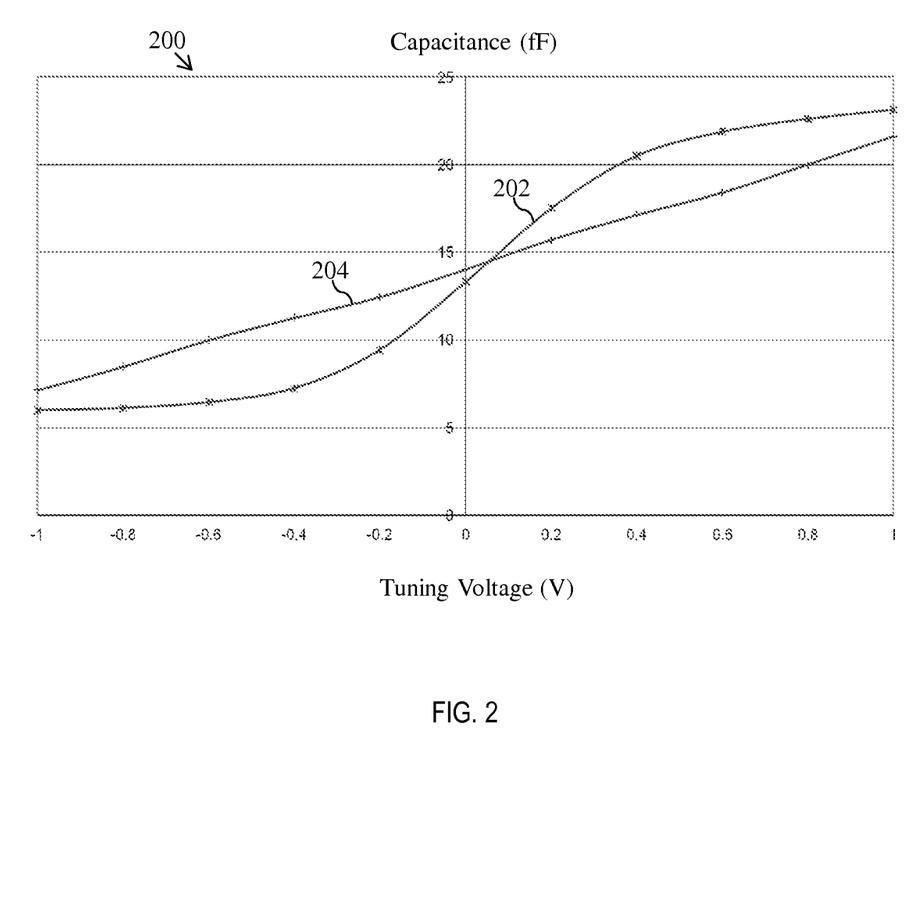
FIG. 2 is a chart depicting capacitance versus tuning range for a single-stage varactor connection and a multi-stage varactor connection.

FIG. 2 is a chart depicting capacitance versus tuning range for a single-stage varactor connection and a multi-stage varactor connection. Plot 202 depicts the capacitance-to-voltage characteristic response of a single-stage varactor connection and plot 204 depicts the capacitance-to-voltage characteristic response of a three-stage varactor connection with different bias voltages applied at each stage. As can be seen from a comparison of the two plots, the three stage varactor connection has a much wider linear tuning range. Specifically, the three-stage varactor has a substantially linear response between the tuning range of −1 Volt (V) and +1V. By contrast, the single-stage varactor connection is an S-shaped curve.

Figure 3:
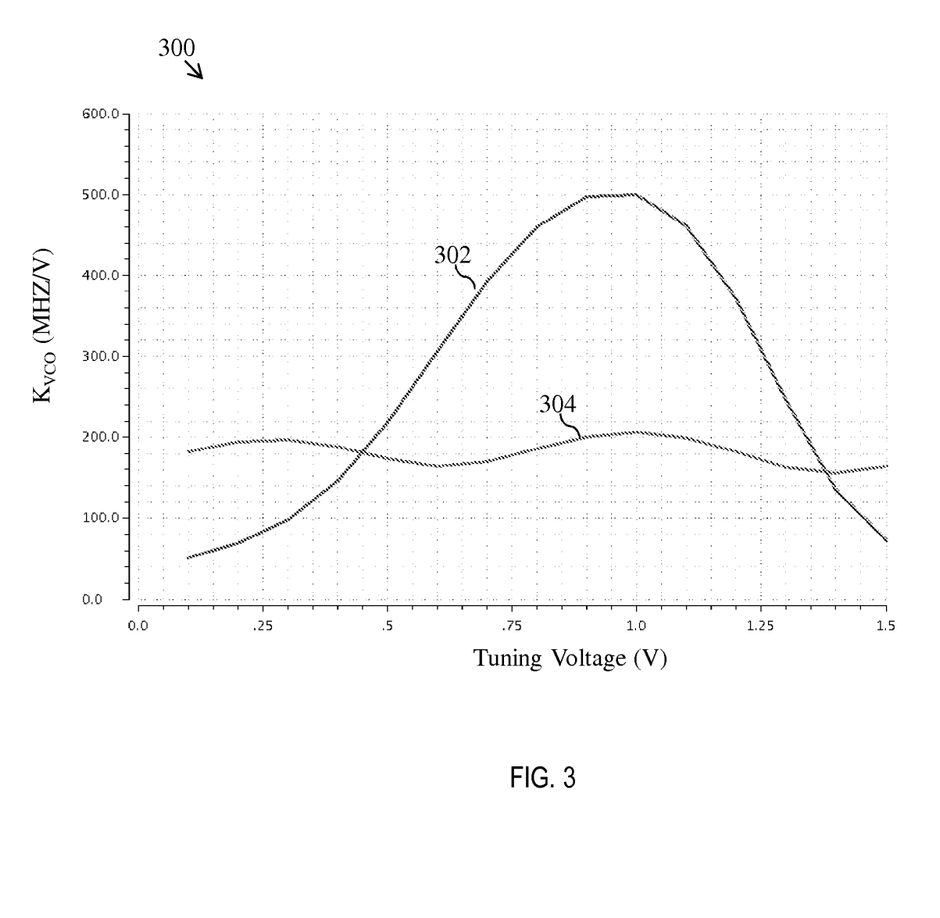
FIG. 3 is a circuit simulation result depicting a VCO gain for different tuning voltages in both a single-stage and multi-stage varactor circuit arrangement.

FIG. 3 is a circuit simulation result depicting a VCO gain for different tuning voltages in both a single-stage and multi-stage varactor circuit arrangement. Plot 302 depicts VCO gain over the tuning range of +0.1V to +1.5V for a single-stage varactor, while plot 304 depicts VCO gain over the same tuning range for a multi-stage varactor. As can be seen, $K_{VCO}$ variation for the multi-stage varactor is substantially constant over the tuning range and significantly more constant than $K_{VCO}$ variation for the single-stage varactor.

III. Digitally-Controlled Switched Varactor Stages

To suppress $K_{VCO}$ variation at different frequency bands, switched varactors are added at each varactor stage of the multi-stage varactor connection, according to an embodiment. A "switched varactor" in this context refers to a varactor that is electrically coupled to a switch such that the varactor's capacitance changes responsive to the tuning voltage when the switch is closed and does not change responsive to the tuning voltage when the switch is open. Digital control signals control the switches to selectively connect varactors to the tuning source. This configuration allows the combined varactor size of the multi-stage varactor connection to be determined/changed based on the digital tuning of the VCO. In some embodiments, the digital control of the multi-stage varactor connection is independent of and not hired wired to the digital tuning signal used to adjust the capacitor array. Instead, a separate control signal is used to independently adjust the varactor size of the multi-stage varactor connection.

Figure 4:
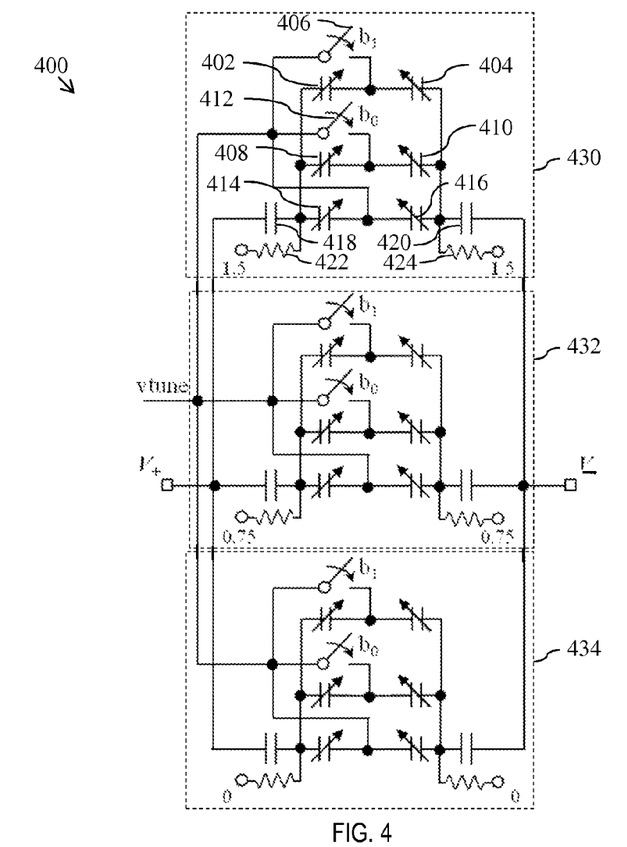
FIG. 4 is a simplified schematic diagram depicting a multi-stage varactor connection with a digitally-controlled switching mechanism.

FIG. 4 is a simplified schematic diagram depicting a multi-stage varactor connection with a digitally-controlled switching mechanism, according to an embodiment. Multi-stage varactor connection 400 includes three varactor stages connected in parallel: varactor stage 430, varactor stage 432, and varactor stage 434. Each varactor stage is implemented by three parallel varactor sub-stages, with two of the varactor sub-stages including switched varactors that are controlled by external digital signals $b_0$ and $b_1$. When the voltage level of $b_0$ and $b_1$ are high, then the corresponding switches are closed to connect the corresponding varactor sub-stages to the tuning source. Conversely, when the voltage levels of $b_0$ and $b_1$ are low then the corresponding switches are open to disconnect the corresponding varactor sub-stages to the tuning source. A bit value of "01", for example, connects the varactors at each stage controlled by digital signal $b_0$ but not the varactors controlled by digital signal $b_1$. The non-switched varactors are connected to the tuning source regardless of the value of the digital control signal.

Referring to varactor stage 430, varactors 402 and 404 are part of a first sub-stage that is controlled by switch 406, varactors 408 and 410 are part of a second sub-stage that is controlled by switch 412, and varactors 414 and 416 are part of a third sub-stage that is not independently controlled by a switch. Thus, varactors 402, 404, 408, and 410 are switched varactors, whereas varactors 414 and 416 are non-switched varactors. In the arrangement depicted, the inner terminals of the switched varactors are coupled to a first contact (e.g., a throw) of the switch associated with the varactor sub-stage, whereas the non-switched varactor is directly coupled to a control line that supplies the tuning voltage. A second contact (e.g., a pole) of switches 406 and 412 are coupled to the control line such that the digital control signal can selectively connect and disconnect varactors from varactor stage 430. Varactor stages 432 and 434 mirror the arrangement of varactor stage 430, albeit the varactors in these stages are biased at different voltage levels Varactors that belong to different varactor stages are biased at different voltage levels. However, varactors that are part of the same varactor stage are biased at the same voltage even though they may belong to different sub-stages. For example, varactors 402, 404, 408, 410, 414, and 416 are all biased at +1.5V even though they belong to three separate sub-stages. To bias each varactor sub-stage, varactors 402, 408, and 414 are electrically coupled to bias resistor 422, and varactors 404, 410, and 416 are electrically coupled to bias resister 424. Varactors that belong to varactor stage 432 are biased at +0.75V, and varactors that belong to varactor stage 434 are biased at 0V.

Each of varactor stages 430, 432, and 434 may include capacitors or other capacitive structures to AC couple multi-stage varactor connection 400 with other components within the VCO. For example, varactor stage 430 includes capacitive structures 418 and 420. Similarly, varactor stages 432 and 434 may each include a set of capacitors for AC coupling. The AC coupling capacitors allow the multi-stage varactors to have operating points isolated from the VCO's operating point.

The number of varactor sub-stages may vary from implementation to implementation. Rather than three varactor sub-stages, for instance, each of varactor stages 430, 432, and 434 may include two varactor sub-stages or one or more additional varactor sub-stages. When more than three varactor sub-stages are employed, additional digital control signals may be used to selectively connect and disconnect the additional respective varactor sub-stages. For example, in an embodiment, a varactor stage with n varactor sub-stages (where n represents a positive integer greater than two and where one of the varactor sub-stages is a non-switched varactor sub-stage) is coupled to n−1 digital control signals such that each switched varactor sub-stage is controlled by a different digital control signal.

Figure 5:
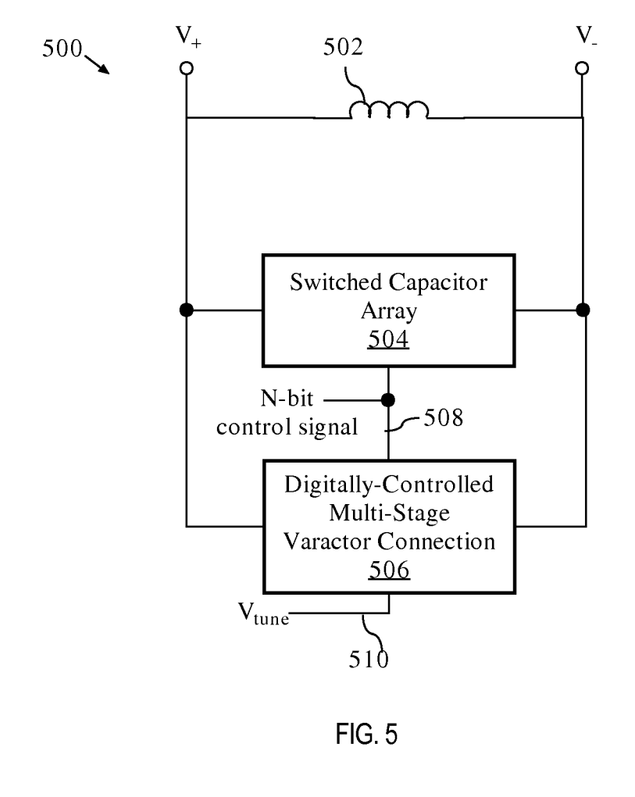
FIG. 5 is a simplified schematic diagram depicting an LC-tank with a switched capacitor array and a digitally-controlled multi-stage varactor.

FIG. 5 is a simplified schematic diagram depicting an LC-tank with a switched capacitor array and a digitally controlled multi-stage varactor, according to an embodiment. LC tank 500 includes inductor 502, switched capacitor array 504, and digitally-controlled multi-stage varactor connection 506. N-bit control signal 508 is coupled to switched capacitor array 504 and digitally-controlled multi-stage varactor connection 506. N-bit control signal 508 is used to digitally tune the VCO by selectively switching capacitors and changing the effective capacitance of switched capacitor array 504. Fine tuning is then applied by adjusting control voltage input 510, which adjusts the effective capacitance of digitally-controlled multi-stage varactor connection 506. Such digital and analog tuning may be controlled by a PLL or some other control logic During digital tuning, n-bit control signal 508 also selectively connects or disconnects varactors to change the effective varactor size of digitally-controlled multi-stage varactor connection 506. Generally, as the frequency band is increased, varactors within the multi-stage varactor connection are disconnected from control voltage input 510. Conversely, as the frequency band is decreased, additional varactors are connected to control voltage input 510. Referring to multi-stage varactor connection 400, for example, at a highest frequency band, digital signals $b_0$ and $b_1$ are set to zero such that the extra two switched varactor sub-stages are disconnected from the control voltage. At a mid-frequency band, one of digital signals $b_0$ and $b_1$ is set to one and the other is set to zero such that one of the switched varactor sub-stages is connected and the other is disconnected. At the lowest frequency band, both digital signals $b_0$ and $b_1$ are set to one such that both switched varactor sub-stages are connected.

Figure 6:
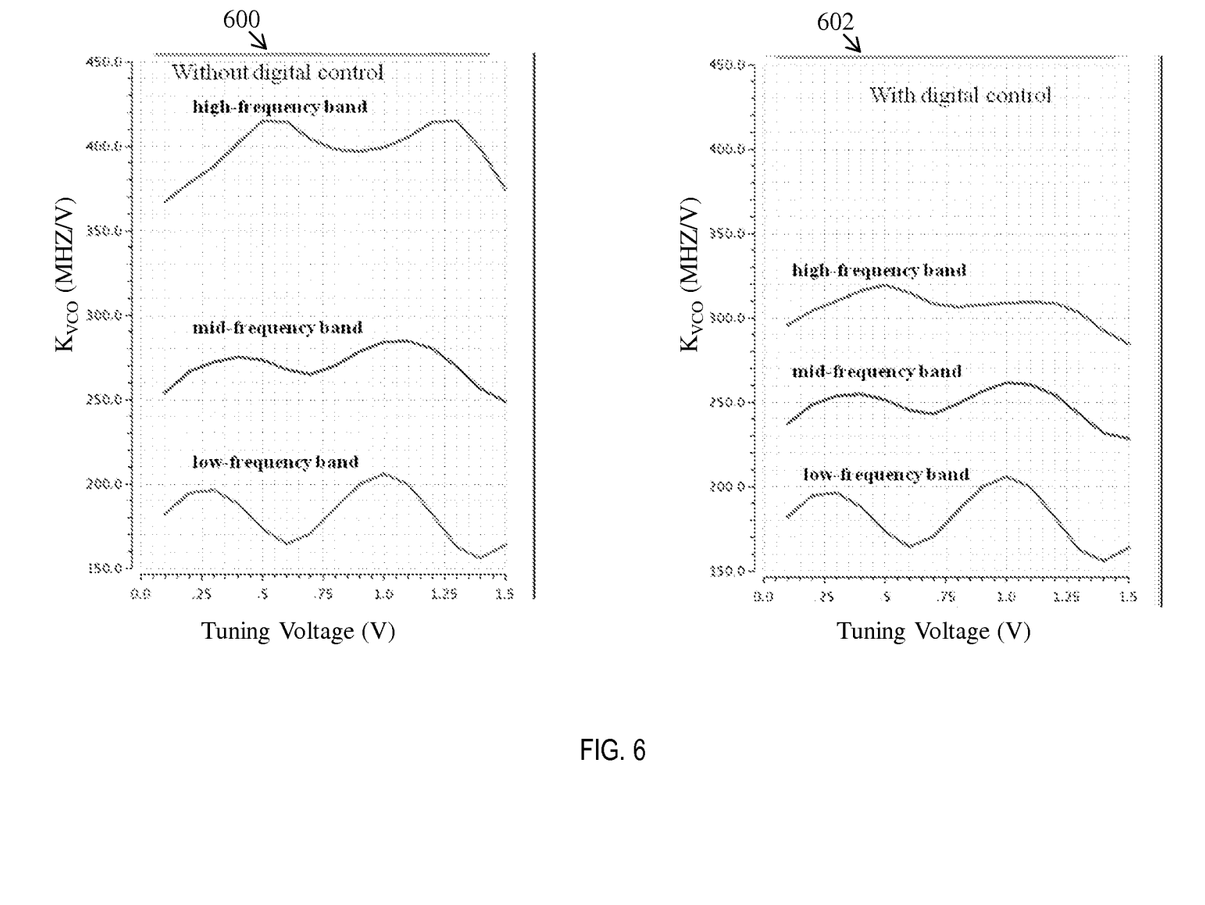
FIG. 6 is a circuit simulation result depicting a VCO gain for different tuning voltages and different frequency bands with a digitally-controlled multi-stage varactor connection and without a digitally-controlled multi-stage varactor connection.

FIG. 6 is a circuit simulation result depicting a VCO gain for different tuning voltages and different frequency bands with a digitally controlled multi-stage varactor connection and without a digitally controlled multi-stage varactor connection. Plot 600 depicts $K_{VCO}$ variation between different frequency bands and across different tuning voltage when a varactor connection without digital control is used. By contrast, plot 602 depicts $K_{VCO}$ variation for the different frequency bands and tuning voltages when a multi-varactor connection with digital control, such as multi-varactor connection 400, is used. As can be seen from the two plots, the digital-control mechanism described above substantially suppresses $K_{VCO}$ variation between the different frequency bands.

IV. Extensions and Alternatives

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A voltage-controlled oscillator comprising:
a varactor connection comprising:
a plurality of varactor stages that are electrically coupled in parallel;
wherein for two or more varactor stages of the plurality of varactor stages, each respective varactor stage of the two or more varactor stages includes a set of one or more varactors that are electrically coupled to a tuning source;
wherein each respective varactor stage of the two or more varactor stages is configured to vary a respective capacitance in response to a tuning voltage from the tuning source;
wherein each respective varactor stage of the two or more varactor stages is configured to be concurrently biased at a different respective voltage level, and
wherein the varactor connection is configured to maintain a gain of the voltage-controlled oscillator irrespective of the tuning voltage from the tuning source, wherein the gain of the voltage-controlled oscillator is defined as a rate of frequency change with tuning voltage.

2. The voltage-controlled oscillator of claim 1, wherein the plurality of varactor stages comprises:
a first varactor stage configured to be biased at a first voltage level;
a second varactor stage configured to be biased at a second voltage level that is different than the first voltage level; and
a third varactor stage configured to be biased at a third voltage level that is different than the first voltage level and the second voltage level.

3. The voltage-controlled oscillator of claim 2, wherein the second voltage level is greater than the first voltage level by an offset amount and wherein the third voltage level is less than the first voltage level by the offset amount.

4. The voltage-controlled oscillator of claim 1, wherein each varactor stage of the two or more varactor stages includes at least one switched varactor and at least one non-switched varactor.

5. The voltage-controlled oscillator of claim 4, wherein the at least one switched varactor is configured to be connected to the tuning source in response to a set of one or more digital control signals.

6. The voltage-controlled oscillator of claim 1, wherein each respective varactor stage of the two or more varactor stages includes a set of one or more capacitive structures that capacitively couple the respective varactor stage with a tank circuit.

7. The voltage-controlled oscillator as recited in claim 1, wherein the apparatus is an integrated circuit package.

8. The voltage-controlled oscillator as recited in claim 1, wherein the plurality of varactor stages are configured to operate in the 60 GHz frequency band.

9. A voltage-controlled oscillator comprising:
a varactor connection comprising:
a plurality of varactor stages;
wherein for two or more varactor stages of the plurality of varactor stages, each respective varactor stage of the two or more varactor stages includes a respective set of one or more switched varactors and a respective set of one or more non-switched varactors;
wherein for each respective varactor stage of the two or more varactor stages, the respective varactor stage is configured such that a digital control signal controls how many switched varactors in the respective set of one or more switched varactors are connected to a tuning source;
wherein for a first varactor stage of the two or more varactor stages, a first switched varactor included in the first varactor stage is configured to be connected to the tuning source based on a first bit of the digital control signal;
wherein for a second varactor stage of the two or more varactor stages, a second switched varactor included in the second varactor stage is configured to be connected to the tuning source based on the first bit of the digital control signal, and
wherein the varactor connection is configured to maintain a gain of the voltage-controlled oscillator irrespective of the tuning voltage from the tuning source, wherein the gain of the voltage-controlled oscillator is defined as a rate of frequency change with tuning voltage.

10. The voltage-controlled oscillator of claim 9,
wherein for a first varactor stage of the two or more varactor stages, the respective set of one or more switched varactors and the respective set of one or more non-switched varactors are biased at a first voltage level;
wherein for a second varactor stage of the two or more varactors stages, the respective set of one or more switched varactors and the respective set of one or more non-switched varactors are biased at a second voltage level that is different than the first voltage level.

11. The voltage-controlled oscillator of claim 9,
wherein for each respective varactor stage of the two or more varactor stages, the respective set of one or more switched varactors includes a plurality of switched varactors that are part of a plurality of varactor sub-stages;
wherein two or more varactor sub-stages of the plurality of varactor sub-stages are configured to be controlled by different bits of the digital control signal.

12. The voltage-controlled oscillator of claim 11, wherein each varactor sub-stage of the two or more varactor sub-stages includes two varactors that are electrically coupled to a switch that is controlled by a respective bit of the digital control signal.

13. The voltage-controlled oscillator of claim 9, further comprising:
a switched capacitor array that is configured such that the digital control signal controls how many capacitors are connected within a voltage controlled oscillator to change an operating frequency band of the voltage controlled oscillator.

14. The voltage-controlled oscillator of claim 13, wherein each varactor stage of the two or more varactor stages is configured such that the digital control signal connects additional switched varactors to the tuning source as the operating frequency band of the voltage controlled oscillator is decreased and disconnects switched varactors from the tuning source as the operating frequency band of the voltage controlled oscillator is increased.

15. The voltage-controlled oscillator of claim 9, wherein each respective varactor stage of the two or more varactor stages includes a set of one or more capacitive structures that capacitively couple the respective varactor stage with one or more other components within a voltage controlled oscillator.

16. The voltage-controlled oscillator of claim 9, wherein the plurality of varactor stages are coupled in parallel;
wherein for each respective varactor stage of the two or more varactor stages, a plurality of varactor sub-stages are electrically coupled in parallel; wherein each varactor sub-stage includes at least one of a switched varactor or a non-switched varactor.

17. The voltage-controlled oscillator as recited in claim 9, wherein the apparatus is an integrated circuit package.

18. A circuit comprising:
   a first varactor stage configured to be biased at a first voltage level;
   wherein the first varactor stage includes a first varactor sub-stage, a second varactor sub-stage, and a third varactor sub-stage;
   wherein the second varactor sub-stage includes a first switch that is configured to connect a first varactor and a second varactor to a tuning source in response to a first control signal;
   wherein the third varactor sub-stage includes a second switch that is configured to connect a third varactor and a fourth varactor to the tuning source in response to a second control signal;
   a second varactor stage configured to be biased at a second voltage level that is different than the first voltage level;
   wherein the second varactor stage includes a fourth varactor sub-stage, a fifth varactor sub-stage, and a sixth varactor sub-stage;
   wherein the fifth varactor sub-stage includes a third switch that is configured to connect a fifth varactor and a sixth varactor to the tuning source in response to the first control signal;
   wherein the sixth varactor sub-stage includes a fourth switch that is configured to connect a seventh varactor and an eighth varactor to the tuning source in response to the second control signal.

19. The circuit of claim 18, further comprising:
   a third varactor stage configured to be biased at a third voltage level that is different than the first voltage level and the second voltage level;
   wherein the third varactor stage includes a seventh varactor sub-stage, an eighth varactor sub-stage, and a ninth varactor sub-stage;
   wherein the eighth varactor sub-stage includes a fifth switch that is configured to connect a ninth varactor and a tenth varactor to the tuning source in response to the first control signal;
   wherein the ninth varactor sub-stage includes a sixth switch that is configured to connect a eleventh varactor and a twelfth varactor to the tuning source in response to the second control signal.

20. The circuit of claim 18, wherein the first varactor sub-stage includes a first non-switched varactor and a second non-switched varactor that are connected to the tuning source, wherein the third varactor sub-stage includes a third non-switched varactor and a fourth non-switched varactor that are connected to the tuning source.

* * * * *